United States Patent [19]
Lin

[11] Patent Number: 6,054,347
[45] Date of Patent: Apr. 25, 2000

[54] METHOD FOR FORMING A MODIFIED CROWN SHAPED, DYNAMIC RANDOM ACCESS MEMORY, (DRAM), CAPACITOR STRUCTURE

[75] Inventor: Chin-Hsiang Lin, Meinung, Taiwan

[73] Assignee: Vanguard International Semiconductor Corporation, Hsin-Chu, Taiwan

[21] Appl. No.: 09/224,718

[22] Filed: Jan. 4, 1999

[51] Int. Cl.[7] .............................................. H01L 21/8242
[52] U.S. Cl. ............................................................. 438/253
[58] Field of Search ........................... 438/253, FOR 212

[56] References Cited

U.S. PATENT DOCUMENTS

| | | | |
|---|---|---|---|
| 5,688,713 | 11/1997 | Linlia et al. ................................ | 437/60 |
| 5,726,086 | 3/1998 | Wu .......................................... | 438/253 |
| 5,728,618 | 3/1998 | Tseng ...................................... | 438/253 |
| 5,733,808 | 3/1998 | Tseng ...................................... | 438/239 |
| 5,907,772 | 5/1999 | Iwasaki . | |

*Primary Examiner*—George Fourson
*Assistant Examiner*—Joannie A. Garcia
*Attorney, Agent, or Firm*—George O. Saile; Stephen B. Ackerman

[57] ABSTRACT

A process for creating a modified crown shaped storage node electrode, for a DRAM capacitor structure, featuring increased surface area resulting via the addition of a silicon hill, to the conventional crown shaped structure, has been developed. A thin, narrow insulator shape, is formed, between two wider, thicker insulator shapes. After deposition of a polysilicon layer, a chemical mechanical polishing procedure is used to form the modified crown shaped storage node electrode, via removal of polysilicon from the top surface of the two wider, thicker insulator shapes, while the polysilicon layer, traversing the thin, narrow insulator shape, is not removed. The thin, narrow insulator shape had been previously formed during an anisotropic RIE procedure, using a photoresist shape as an etch mask, with the photoresist shape, being narrower and thinner than counterpart photoresist shapes, used as an etch mask for patterning of the two wider, thicker insulator shapes.

26 Claims, 9 Drawing Sheets

METHOD FOR FORMING A MODIFIED CROWN SHAPED, DYNAMIC RANDOM ACCESS MEMORY, (DRAM), CAPACITOR STRUCTURE

BACKGROUND OF THE INVENTION (1) Field of the Invention

The present invention relates to a method used to create a capacitor structure, for a dynamic random access memory, (DRAM) device, and more specifically a method used to fabricate a DRAM, crown shaped capacitor structure.

(2) Description of the Prior Art

The semiconductor industry is continually striving to improve semiconductor device performance, while still attempting to reduce the manufacturing costs of these semiconductor devices. These objectives have been in part realized by the ability of the semiconductor industry to fabricate semiconductor memory chips, using sub-micron features. The use of sub-micron features, or micro-miniaturization, results in reductions of performance degrading capacitances and resistances. In addition the use of smaller features result in a smaller chip, however still possessing the same level of integration obtained for larger semiconductor chips, fabricated with larger features. This allows a greater number of the denser, smaller chips to be obtained from a specific size starting substrate, thus resulting in a lower manufacturing cost for an individual chip.

The use of sub-micron features however, in some areas, can adversely influence the performance of a DRAM device. The DRAM device is usually comprised of a stacked capacitor, (STC), structure, overlying a transfer gate transistor, and connected to the source of the transfer gate transistor. However the decreasing size of the transfer gate transistor, limits the dimensions of the STC structure. To increase the capacitance, and thus the performance of STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area, available for the placement of an overlying STC structure.

One method of maintaining, or increasing STC capacitance, while still decreasing the lateral dimension of the capacitor, has been the use of a crown shaped, storage node structure, comprised of vertical features of silicon, connected to a horizontal silicon feature, with the horizontal silicon feature, overlying and contacting, the top surface of a storage node contact plug, which in turn contacts a source region of an underlying transfer gate transistor. The increased surface area, presented by the vertical features of the crown shaped structure, results in an increase in capacitance, without increasing the lateral dimensions of the capacitor structure. However increasing DRAM cell densities, comprised with smaller transfer gate transistors, and designed to offer increased DRAM performance, demand even more capacitance, or capacitor surface increase, then offered with conventional crown shaped structures.

This invention will describe a process for creating a modified crown shaped, storage node structure, for a DRAM device, in which another vertical silicon feature is created in the center, between the vertical silicon features, of the conventional crown shaped, storage node structure, thus offering increased capacitor surface area, when compared to conventional crown shaped, storage node structures. The center vertical silicon feature, or "silicon hill feature", is created via a series of novel processes, featuring the creation of a center insulator shape, narrower and thinner, than the insulator shapes used to create the outer, vertical silicon features of the crown shaped, storage node structure. Thus deposition of a polysilicon layer, on all shapes, is followed by a chemical mechanical polishing, (CMP), procedure, removing polysilicon in regions overlying the thicker, wider, outside insulator shapes, but not removing polysilicon in regions in which polysilicon overlaid the narrower, thinner, insulator shape, thus creating the modified crown shaped, storage node structure, comprised of outer, vertical silicon shapes, a silicon hill shape, between the outer, vertical silicon shapes, all connected to an underlying horizontal silicon shape. Prior art, such as Wu, in U.S. Pat. No. 5,726,086, describes a process for forming crown shaped, storage node structure, however that prior art does not use the narrow, thinner insulator shape, or the novel photolithographic procedure used to create that shape, that is featured in this invention, offering a simpler procedure for creation of the modified crown shaped, storage node structure.

SUMMARY OF THE INVENTION

It is an object of this invention to increase the surface area of a DRAM capacitor structure, via the use of a modified crown shaped, storage node structure.

It is another object of this invention to form a modified crown shaped, storage node structure, comprised of a center, vertical silicon feature, or a silicon hill, located between the two outer vertical silicon features, with all of the vertical features connected to a underlying, horizontal silicon feature.

It is still another object of this invention to form the silicon hill feature, via deposition of a polysilicon layer, on an underlying insulator shape, comprised of a shape, narrower, and thinner, then the insulator shapes used for the formation of the outer vertical silicon features, of the modified crown shaped, storage node structure.

It is still yet another object of this invention to form the narrower, thinner, insulator shape, used for creation of the silicon hill, via a dry etch procedure, using an etch mask comprised of a narrow, tapered profile, photoresist shape.

It is still yet another object of this invention to further increase the surface area of the modified crown shaped, storage node structure, via the formation of a hemispherical grain, (HSG), silicon layer, on the top surface of the modified crown shaped, storage node structure.

In accordance with the present invention a method for forming a modified crown shaped, storage node structure, featuring a silicon hill, located between the outside, vertical silicon features, of the modified crown shaped, storage node structure, has been developed. After creation of transfer gate transistors comprised of: a thin gate insulator; an insulator capped, polysilicon gate structure, a lightly doped source/drain region; insulator spacers on the sides of the polysilicon gate structure; and a heavily doped source/drain region; a first insulator is deposited. After deposition and planarization of a second insulator layer, a storage node contact hole is opened in the insulator layers, exposing a source region of the transfer gate transistor. A first conductive plug is formed in the storage node contact hole, followed by the deposition of a third insulator layer. After opening a via hole in the third insulator layer, exposing the top surface of the underlying first conductive plug, a second conductive plug is next formed in the via hole, overlying the first conductive plug. A thin silicon nitride layer, and an overlying fourth insulator layer are next deposited, followed by the formation of a photoresist pattern, comprised of a narrow, thin, photoresist shape, located between, two, wider, thicker photoresist shapes. An anisotropic dry etch procedure, using the photoresist pattern as an etch mask, is used to create a thin, narrow, fourth insulator shape, on the underlying silicon layer, directly overlying the second conductive plug, located between two, wide, thick, fourth insulator shapes, on the underlying silicon nitride layer, and with the width of the narrow, thin, insulator shape, narrower than the width of the second conductive plug. A polysilicon layer is deposited, followed by a chemical mechanical polishing, (CMP), procedure, removing polysilicon only from the top surface of the wide, thick, insulator shapes, creating a modified crown shaped structure, comprised of: two vertical polysilicon features, on the sides of the wide, thick, fourth insulator shapes; a silicon hill, overlying the narrow, thin, fourth insulator shape; and a horizontal polysilicon shapes, connecting the vertical polysilicon features, to the silicon hill. Removal of the fourth insulator layer, is followed by the formation of a hemispherical grain, (HSG), silicon layer, on the modified crown shaped, storage node shape. Formation of a capacitor dielectric layer, and of an overlying polysilicon upper electrode complete the process for creation of a DRAM capacitor structure, comprised with a modified crown shaped, storage node structure, featuring a HSG silicon layer on the vertical, horizontal, and silicon hill features, of the modified crown shaped structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM capacitor structure, featuring a modified crown shaped, storage node structure, comprised with a silicon hill feature, located between the vertical polysilicon features of the crown shaped structure, and used to increase the surface area, and the capacitance of a DRAM capacitor, will now be described in detail. The transfer gate transistor, used for the DRAM device, in this invention, will be an N channel device. However the modified crown shaped, storage node structure, featuring the silicon hill, described in this invention, can also be applied to P channel, transfer gate transistor.

Figure 1:
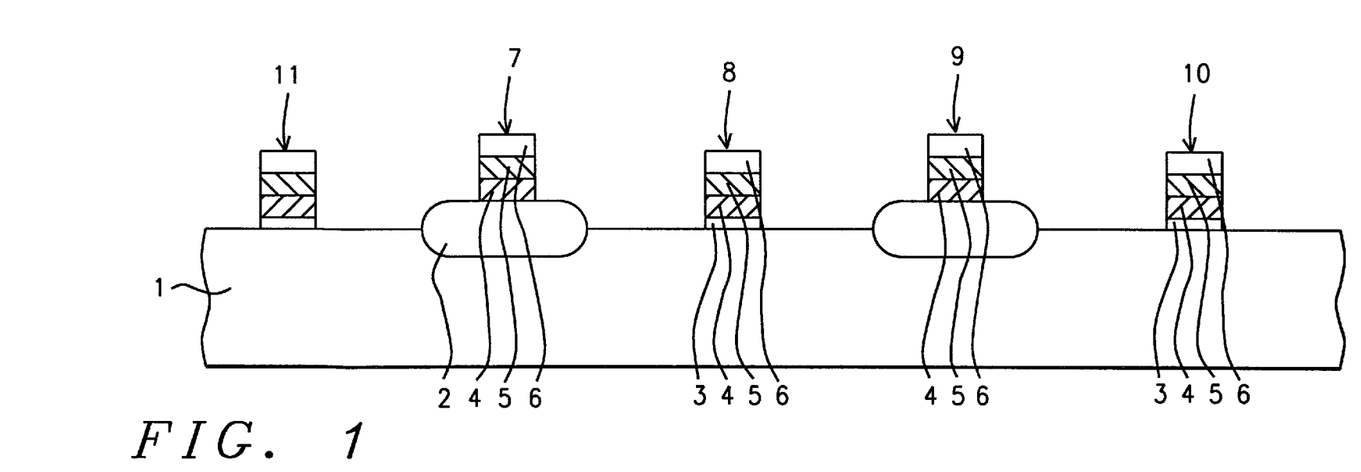
FIGS. 1–11, which schematically, in cross-sectional style, show the key fabrication stages used to create a DRAM capacitor structure, featuring a modified crown shaped, storage node structure.

Referring to FIG. 1, a P type, semiconductor substrate 1, with a <100>, single crystalline orientation, is used. Field oxide, (FOX), regions 2, used for isolation purposes, are formed via thermal oxidation procedures, using a patterned oxidation resistant mask, such as a silicon nitride—silicon oxide composite insulator layer, to protect subsequent device regions from the oxidation procedure. After formation of FOX regions 2, at a thickness between about 2000 to 5000 Angstroms, the composite insulator layer is removed, using hot phosphoric acid for silicon nitride, while a buffered hydrofluoric acid solution is used for the underlying silicon oxide layer. After a series of wet cleans, a gate insulator layer 3, of silicon oxide is thermally grown in an oxygen-steam ambient, at a temperature between about 750 to 1050° C., to a thickness between about 40 to 200 Angstroms. A polysilicon layer 4, is next deposited using low pressure chemical vapor deposition, (LPCVD), procedures, at a temperature between about 500 to 700° C., to a thickness between about 500 to 2000 Angstroms. The polysilicon can either be grown intrinsically and doped via ion implantation of arsenic or phosphorous, at an energy between about 10 to 80 KeV, and using a dose between about 1E13 to 1E16 atoms/$cm^2$, or the polysilicon layer can be grown using in situ doping procedures, via the incorporation of either arsine or phosphine to the silane or disilane ambient. A metal silicide layer 5, comprised of tungsten silicide, is next deposited, via LPCVD procedures, to a thickness between about 500 to 2000 Angstroms, using silane, or dichlorosilane, and tungsten hexafluoride as a source, creating a polycide layer, comprised of metal silicide layer 5, overlying polysilicon layer 4. An insulator layer 6, comprised of silicon oxide, and used as a cap insulator layer, is next grown via the use of either LPCVD or plasma enhanced chemical vapor deposition, (PECVD), procedures to a thickness between about 600 to 2000 Angstroms. Insulator layer 6, can also be a silicon nitride layer, again deposited using LPCVD or PECVD procedures, to a thickness between about 600 to 2000 Angstroms. Conventional photolithographic and reactive ion etching, (RIE), procedures, using $CHF_3$ as an etchant for insulator layer 6, ($CF_4$ if insulator layer 6, is a silicon nitride layer), and using $Cl_2$ as an etchant for metal silicide layer 5, and for polysilicon layer 4, are used to create the polycide gate structure 7–11, capped with overlying capping, insulator layer 6, and shown schematically in FIG. 1. Removal of the photoresist shape, used for polycide gate patterning, is accomplished via plasma oxygen ashing and careful wet cleans.

Figure 2:
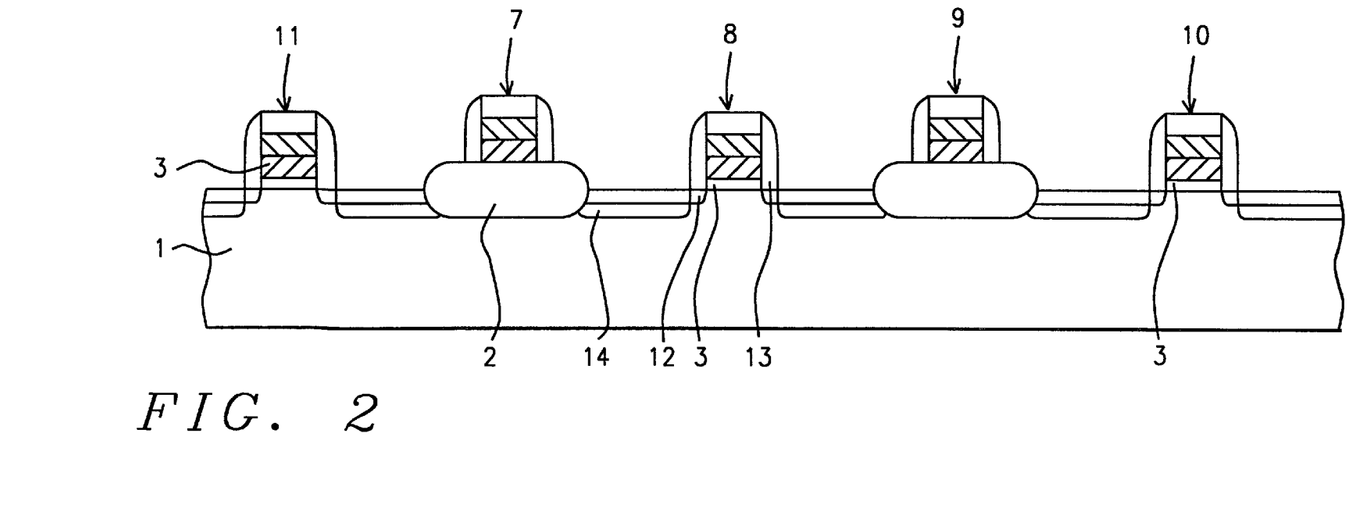

A lightly doped source/drain region 12, is next formed via ion implantation of phosphorous, at an energy between about 5 to 60 KeV, at a dose between about 1E13 to 1E15 atoms/$cm^2$. An insulator layer, comprised of silicon oxide, is then deposited using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 13, on the sides of polycide gate structure 7–11. Insulator spacers 13, can also be comprised o f silicon nitride . A heavily doped source/drain region 14, is then formed via ion implantation of arsenic, at an energy between about 30 to 100 KeV, at a dose between about 1E14 to 5E16 atoms/$cm^2$. The result of these steps are also shown schematically in FIG. 2.

Figure 3:
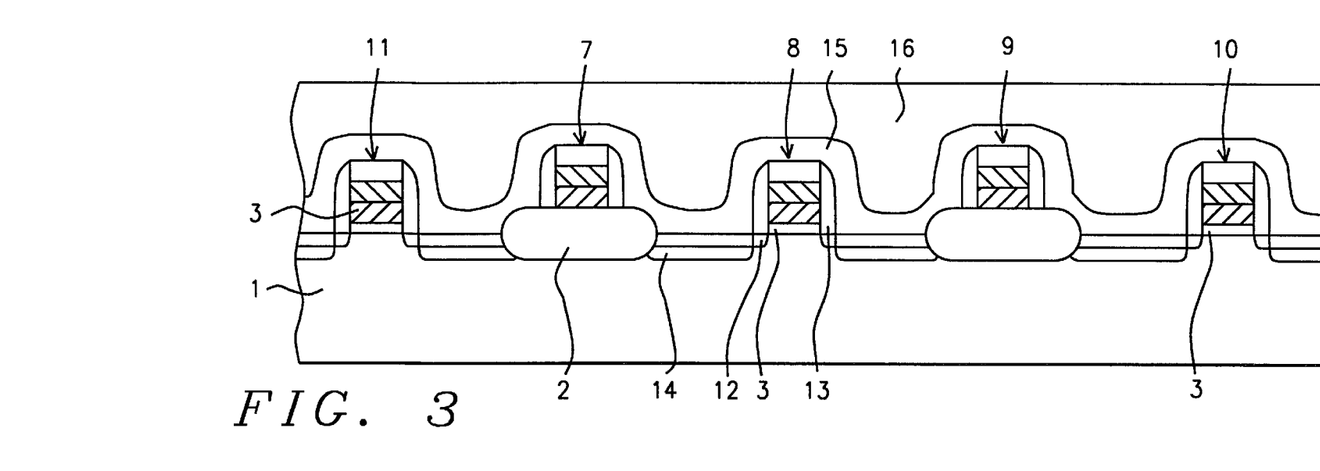

Insulator layer 15, comprised of silicon oxide, is next deposited, using LPCVD or PECVD procedures, at a temperature between about 400 to 700° C., to a thickness between about 100 to 10000 Angstroms. Insulator layer 15, is grown using tetraethylorthosilicate, (TEOS) as a source. A first borophosphosilicate glass, (BPSG), layer 16, is next grown, via LPCVD or PECVD procedures, to a thickness between about 3000 to 20000 Angstroms, using diborane and phosphine, as well as TEOS, as reactants. A CMP procedure is then used for planarization, resulting in a smooth top surface topography, for first BPSG layer 16. This is schematically shown in FIG. 3.

Conventional photolithographic and RIE procedures, using $CHF_3$ as an etchant for BPSG layer 16, and for insulator layer 15, are used to open storage node contact holes 60, exposing the top surface of heavily doped source/drain region 14. Storage node contact holes 60, are formed with a slight taper, as shown schematically in FIG. 4. Removal of the photoresist shape, used to open the storage node contact holes 60, is performed via use of plasma oxygen ashing and careful wet cleans procedures.

Figure 4:
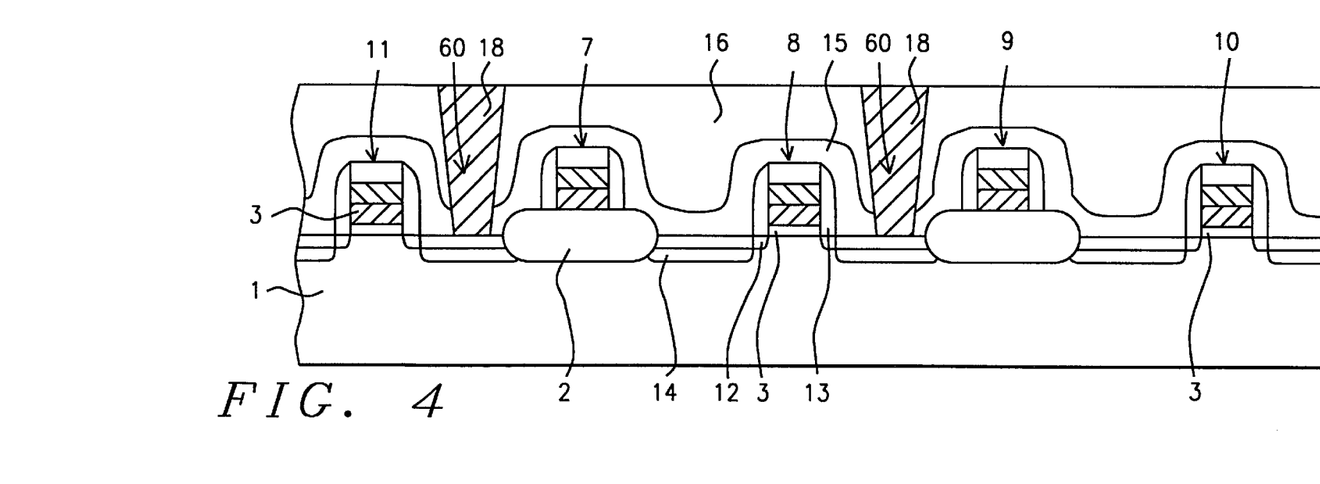

Lower conductive plugs 18, shown schematically in FIG. 4, are next formed in storage node contact holes 60. Lower conductive plugs 18, are comprised of either doped polysilicon, or tungsten. The doped polysilicon plugs are formed via deposition of an in situ doped, polysilicon layer, via LPCVD procedures, to a thickness between about 500 to 5000 Angstroms, via the addition of arsine or phosphine, to a silane ambient. Removal of unwanted conductive material, from the top surface of BPSG layer 16, is accomplished via a CMP procedure, or a selective RIE procedure, using $Cl_2$ as an etchant. If lower conductive plugs 18, are comprised of tungsten, the tungsten layer is again obtained via an LPCVD procedure, using tungsten hexafluoride as a source, and followed by either a CMP or selective RIE procedure, using $Cl_2$ as an etchant, to create lower conductive plugs 18, in storage node contact holes 60, contacting the top surface of heavily doped source/drain region 14.

Figure 5:
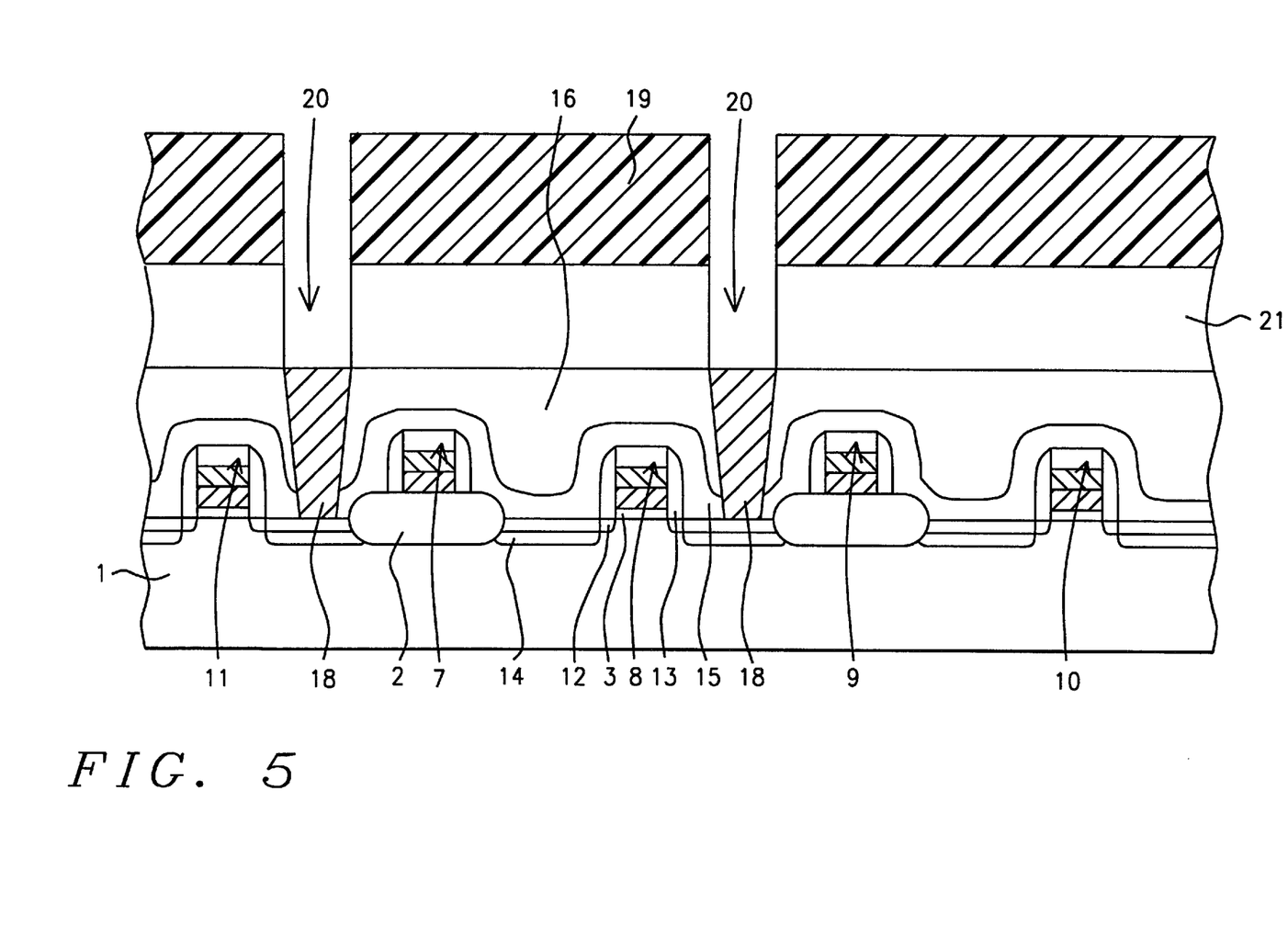
Figure 6:
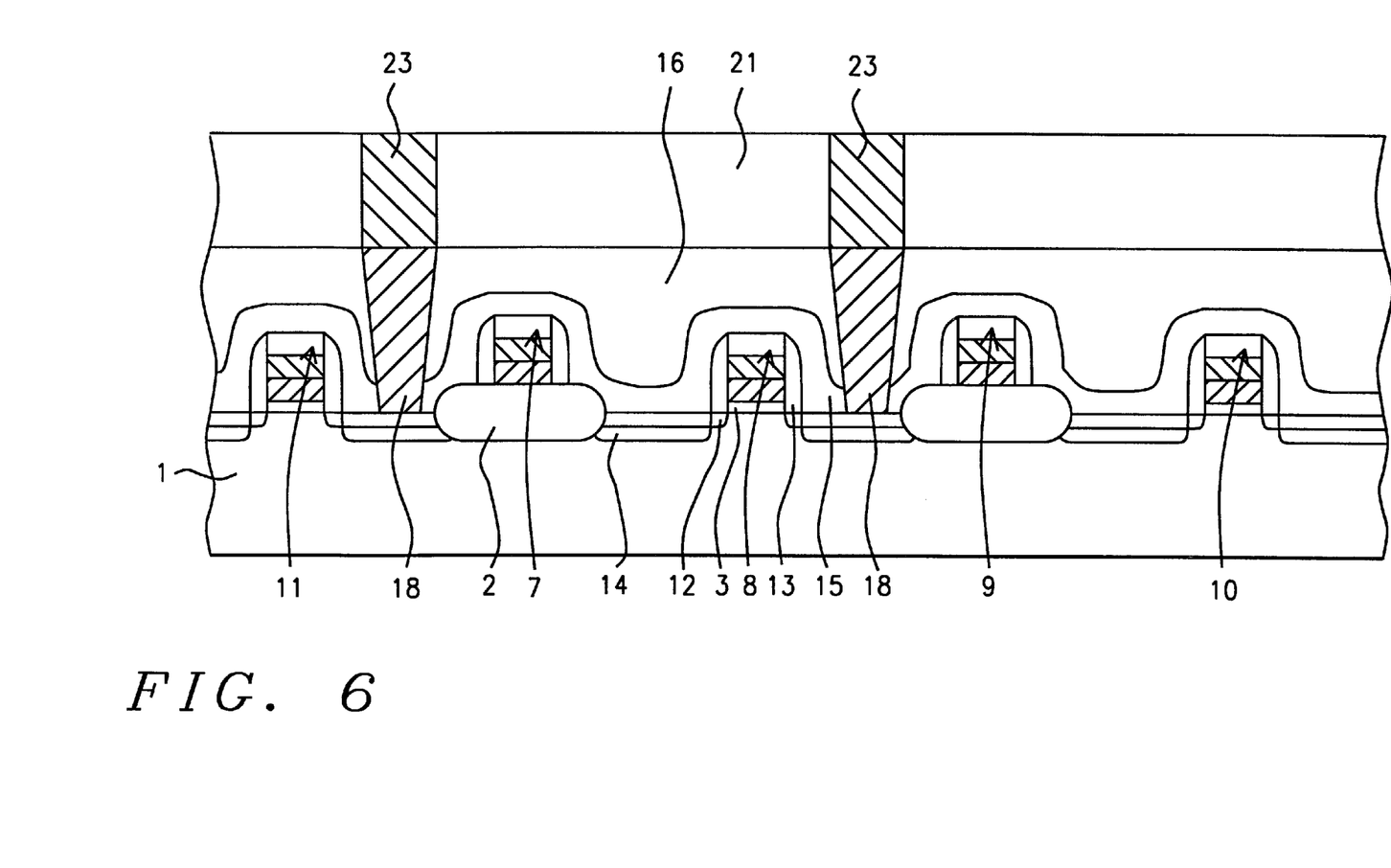

A second BPSG layer 21, is next deposited using PECVD or LPCVD procedures, to a thickness between about 1000 to 10000 Angstroms. Photoresist shape 19, is used as a mask, to allow an anisotropic RIE procedure, using $CHF_3$ as an etchant, to open via holes 20, in BPSG layer 21, exposing the top surface of lower conductive plugs 18. This is schematically shown in FIG. 5. After removal of photoresist shape 19, via plasma oxygen ashing and careful wet cleans, upper conductive plugs 23, are formed in via holes 20, and shown schematically in FIG. 6. Upper conductive plugs 23, can be doped polysilicon, created using deposition and patterning procedures, identical to the procedures used to create lower conductive plugs 18, or upper conductive plugs 23, can be comprised of tungsten, again created via deposition and patterning procedures, identical to the procedures used to create the tungsten, lower conductive plugs 18. If desired a titanium—titanium spacer, can be created on the sides of via holes 20, prior to tungsten deposition. This is accomplished by deposition of the titanium—titanium nitride layer, followed by a anisotropic RIE procedure, resulting in the spacer formation. Therefore storage node contact structures, comprised of an upper conductive plug 23, directly overlying lower conductive plug 18, contacting heavily doped source/drain region 14, has been established. The width of upper conductive plugs 23, is between about 1500 to 3000 Angstroms.

Figure 7:
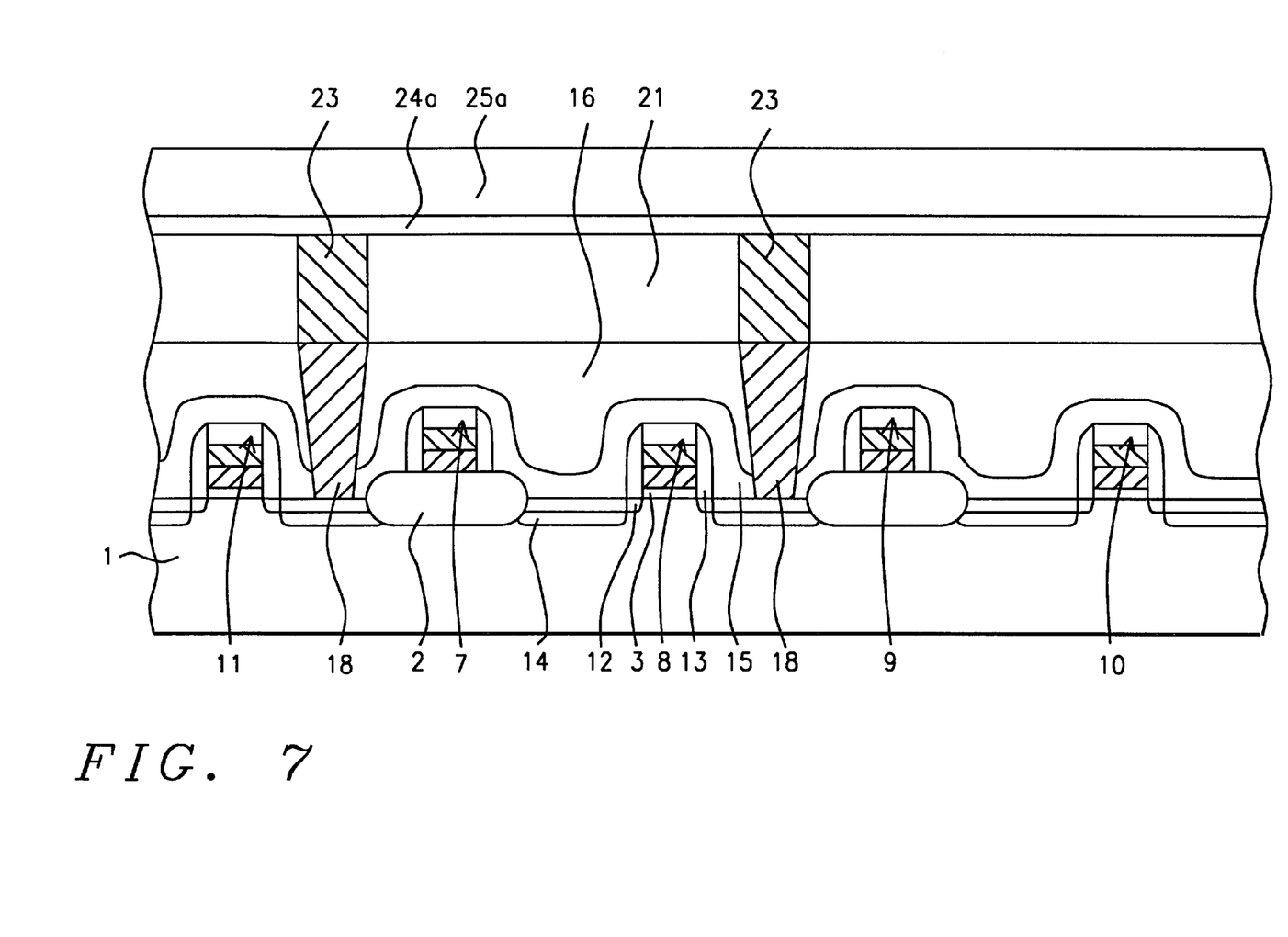
Figure 8:
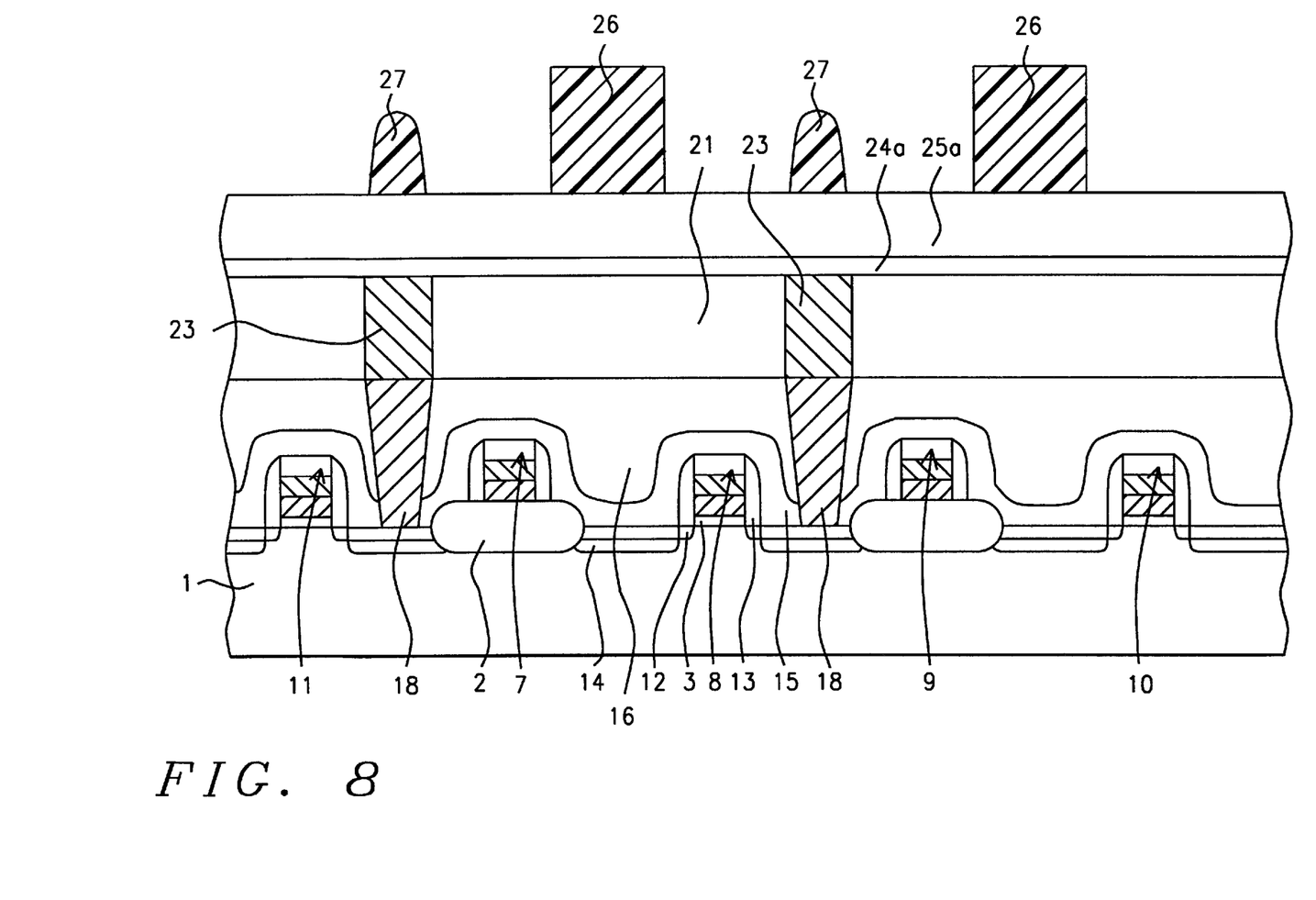

A silicon nitride layer 24a, is next deposited, via LPCVD or PECVD procedures, to a thickness between about 50 to 1000 Angstroms, followed by a third BPSG layer 25a, again deposited using LPCVD or PECVD procedures, to a thickness between about 1000 to 20000 Angstroms. The result of these depositions is schematically shown in FIG. 7. A critical aspect of this invention, the creation of photoresist shapes 26 and 27, is next addressed, and schematically shown in FIG. 8. The width of unexposed photoresist regions, after development of exposed photoresist regions, used as photoresist shapes 26, are between about 1500 to 3000 Angstroms. However the width of the unexposed photoresist region, in the are a used for narrow photoresist shapes 27, is only between about 1000 to 2000 Angstroms. Therefore narrow photoresist shapes 27, were influenced by the exposure procedure, to a greater degree than wider photoresist shapes 26, resulting in a degree of exposure, at the edges of narrow photoresist shapes 27, thus resulting in the tapered, and thinner photoresist shapes 27, in contrast to the thicker and wider, photoresist shapes 26, in which a similar exposure procedure, did not influence the resulting shape, after development.

Figure 9:
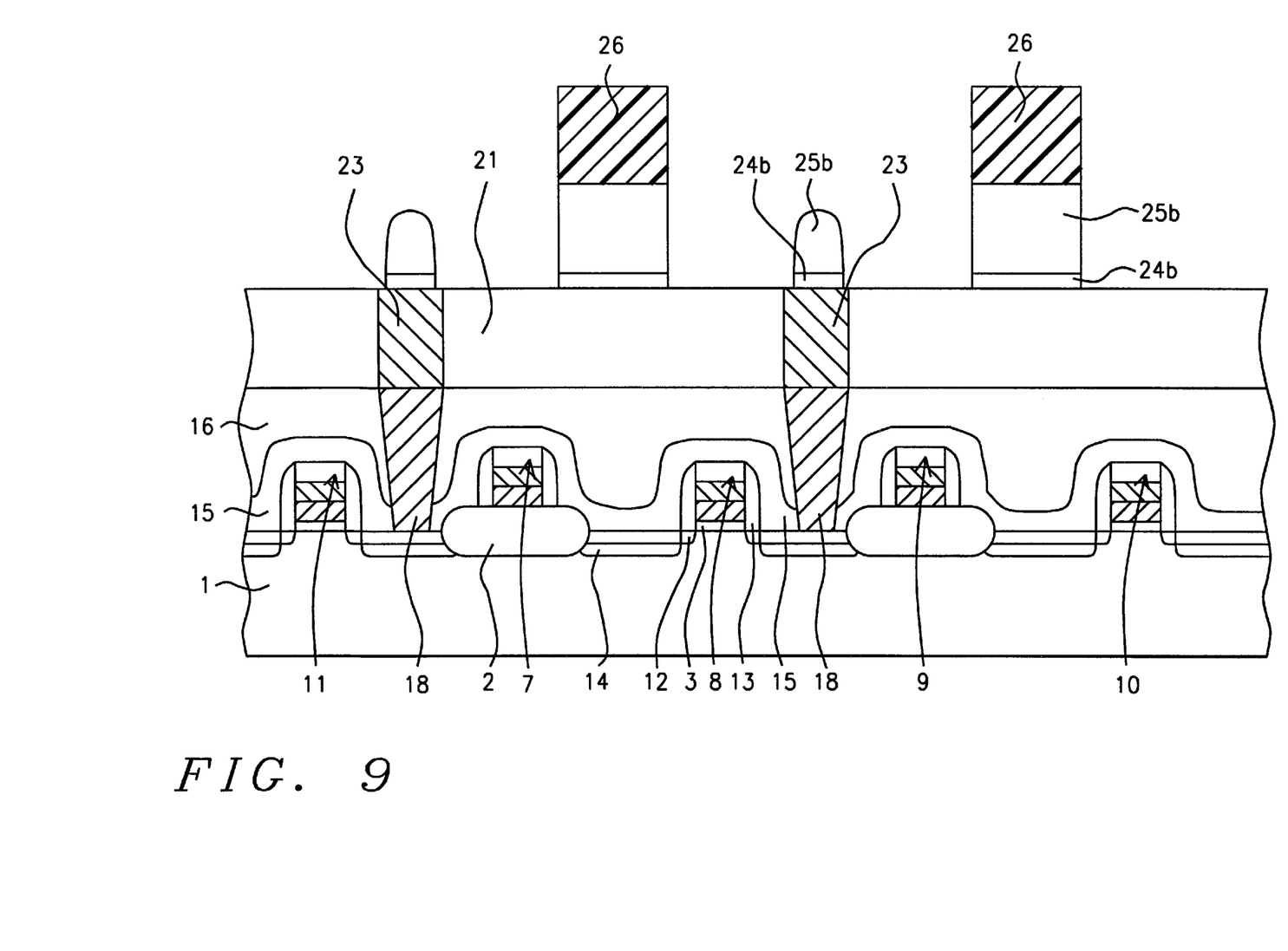

Photoresist shapes 26 and 27, are then used as an etch mask, allowing an anisotropic RIE procedure, using $CHF_3$ as an etchant for the BPSG layer 25a, and using $CF_4$ as an etchant for the silicon nitride layer 24a, to create wide, BPSG 25b, silicon nitride 24b, shape, between about 1500 to 3000 Angstroms in width, and between about 1000 to 20000 Angstroms in thickness, underlying wide, photoresist shape 26, while the identical anisotropic RIE procedure, resulted in thin, narrow BPSG 25b, silicon nitride 24b, shape, between about 800 to 2000 Angstroms in width, and between about 800 to 18000 Angstroms in thickness, overlying upper conductive plug 23, in a region initially masked by the narrow, and tapered photoresist shape 27. Photoresist shape 27, was eroded during the anisotropic RIE procedure, thus resulting in the thinner, narrower, BPSG/silicon nitride shape, while thicker photoresist shape 26, used as a mask for the wider, BPSG/silicon nitride shapes, withstood the anisotropic RIE procedure. This is schematically shown in FIG. 9.

Figure 10:
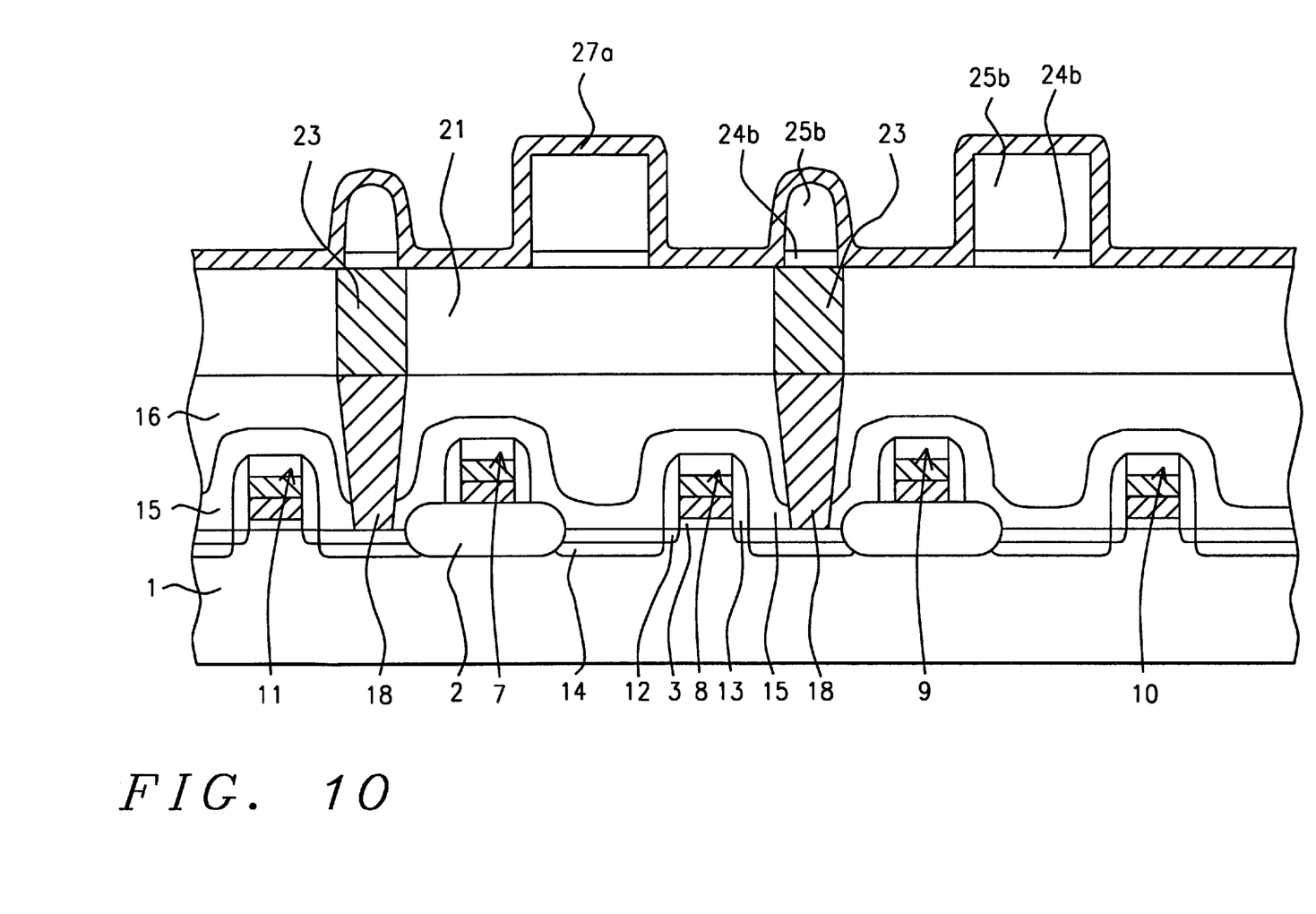
Figure 11:
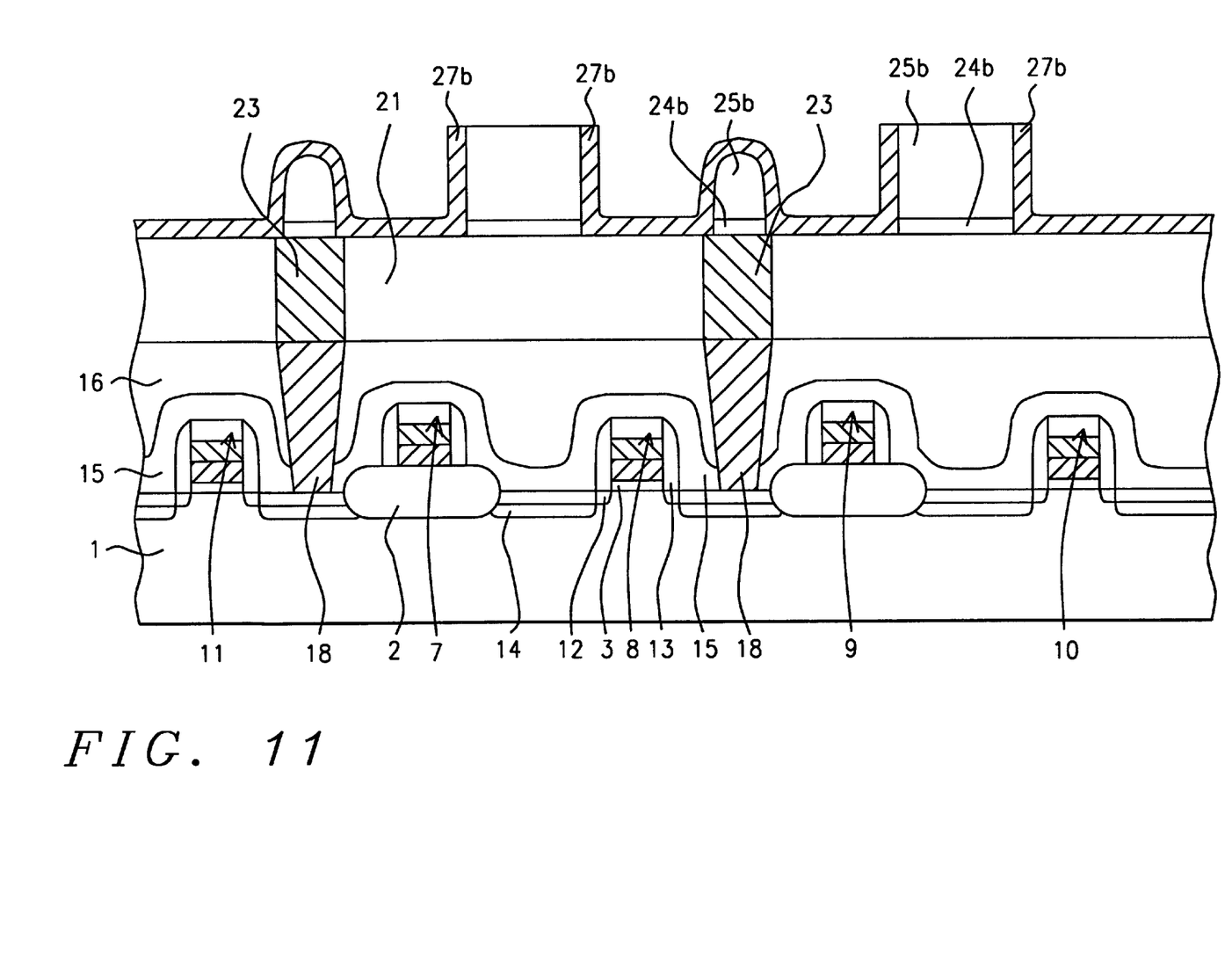

After removal of photoresist shapes 26, via plasma oxygen ashing and careful wet cleans, a polysilicon layer 27a, is deposited, via LPCVD procedures, to a thickness between about 200 to 2000 Angstroms. Polysilicon layer 27a, is doped in situ, during deposition, via the addition of arsine, or phosphine, to a silane ambient. Polysilicon layer 27a, schematically shown in FIG. 10, is deposited conformally on the wide, thick, as well as on the thin, narrow, BPSG/silicon nitride shapes. A CMP procedure, next employed, allows the removal of polysilicon layer 27a, from the top surface of the wide BPSG/silicon nitride shapes, however without removal of polysilicon layer 27a, from the thinner, narrower BPSG/silicon nitride shapes. This results in individual crown shaped polysilicon structures 27b, featuring a silicon hill at the center of the structure, with the crown shaped polysilicon structure 27b, comprised of vertical polysilicon features, on the sides of the wide, BPSG/silicon nitride shapes, connected by a horizontal polysilicon feature, traversing the thinner, narrow BPSG/silicon nitride shape, resulting in the silicon hill in the region in which the horizontal polysilicon shape overlaid the narrow, BPSG/silicon nitride shape. This is schematically shown in FIG. 11. It can also be seen that the width of upper conductive plug 23, is wider than the width of the bottom of the thinner, narrower BPSG/silicon nitride shape, thus allowing the horizontal polysilicon feature, of crown shaped structure 27b, to make contact with upper conductive plug 23.

FIG. 12, schematically shows the result of removal of the wide, BPSG shape via buffered hydrofluoric acid solution. The silicon nitride shapes 24b, protect underlying BPSG layer 21, from the buffered hydrofluoric acid procedure. The creation of a hemispherical grain, (HSG), silicon layer 28, on a crown shaped structure 27b, is next addressed and shown schematically in FIG. 13. (Only one crown shaped structure will be shown in FIG. 13). First HSG silicon seeds are selectively formed on the polysilicon surface of crown shaped structure 27b, in a LPCVD tool, at a temperature between about 400 to 570° C., at a pressure between about 0.05 to 1.0 torr, using a silane, or a disilane flow. Next an anneal cycle is used to grow HSG silicon layer 28, from the HSG silicon seeds, at a temperature between about 550 to 620° C., in a LPCVD tool, at a pressure between about 1E-8 to 1E-9 torr, in a nitrogen carrier gas. This results in the creation of a crown shaped, storage node structure, featuring the silicon hill, comprised of HSG silicon layer, overlying crown shaped, polysilicon shape 27b.

The completion of the DRAM capacitor structure, featuring the crown shaped, storage node structure, comprised with the silicon hill, is next addressed, and shown schematically in FIG. 14. A capacitor dielectric layer 29, exhibiting a high dielectric constant, such as ONO, (Oxidized—silicon Nitride—silicon Oxide), is next formed. The ONO layer is formed by initially growing a silicon dioxide layer, on HSG silicon layer 28, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. This is schematically shown in FIG. 14. A polysilicon layer, is next deposited, via LPCVD procedures, to a thickness between about 1000 to 2000 Angstroms. The polysilicon layer is in situ doped, during deposition, via the addition of arsine or phosphine, to a silane or disilane ambient. Photolithographic and RIE procedures, using $Cl_2$ as an etchant for polysilicon, is employed to create polysilicon upper electrode structure 30, completing the procedure used to create DRAM capacitor structure 31, schematically shown in FIG. 14. The photoresist shape, used as a mask for patterning of polysilicon upper electrode 30, is once again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a capacitor structure, for a DRAM device, on a semiconductor substrate, comprising the steps of:

providing transfer gate transistors, on said semiconductor substrate, with each transfer gate transistor comprised of a polycide gate structure, on a gate insulator layer, with insulator spacers on the sides of each said transfer gate transistor, and a source/drain region in an area of said semiconductor substrate, not covered by said polycide gate structure;

forming a storage node contact hole, in a first insulator layer, exposing the top surface of a source region, of said source/drain region;

forming a lower conductive plug, in said storage node contact hole;

forming a via hole, in a second insulator layer, exposing the top surface of said lower conductive plug;

forming an upper conductive plug, directly overlying said lower conductive plug;

depositing a composite insulator layer, comprised of an underlying silicon nitride layer, and an overlying third insulator layer;

forming two wide photoresist shapes, each with a width between about 1500 to 3000 Angstroms, on said composite insulator layer, while forming a third photoresist shape, on said composite insulator layer, with said third photoresist shape located between said two wide photoresist shapes, directly overlying said upper conductive plug, and with said third photoresist shape, narrower and thinner than said two wide photoresist shapes, with a width between about 1000 to 2000 Angstroms, and with a thickness less than the thickness of said two wide photoresist shapes;

anisotropic etching to form two wide composite insulator shapes, in said composite insulator layer, each with a width between about 1500 to 3000 Angstroms, and at a thickness between about 1000 to 20000 Angstroms, using said two wide photoresist shapes as an etch mask, while said anisotropic etching forms a thin, narrow composite insulator shape, in said composite insulator layer, with said thin, narrow composite insulator shape having a thickness between about 800 to 18000 Angstroms, and having a width between about 800 to 2000 Angstroms, using said third photoresist shape as an etch mask, with said thin, narrow composite insulator shape, directly overlying said upper conductive plug, and with said thin, narrow composite insulator shape, narrower in diameter than the diameter of said upper conductive plug;

depositing a polysilicon layer;

removing said polysilicon layer from the top surface of said two wide composite insulator shapes, resulting in a crown shaped polysilicon structure, comprised of vertical polysilicon features, on the sides of said two wide composite insulator shapes, and comprised of a horizontal polysilicon feature, connecting said vertical polysilicon features, and with said horizontal polysilicon feature, traversing said thin, narrow, composite insulator shape, and contacting the region of said upper conductive, not covered by said thin, narrow composite insulator shape;

removing said third insulator layer from said two wide composite insulator shapes;

forming a hemispherical grain, (HSG), on said crown shaped polysilicon structure, resulting in a crown shaped storage node structure, featuring a silicon hill, located between said vertical polysilicon features, with said silicon hill comprised of said polysilicon layer, and said HSG layer, traversing said thin, narrow composite insulator shape;

forming a capacitor dielectric layer on said crown shaped storage node structure; and forming a polysilicon upper electrode, on said capacitor dielectric layer.

2. The method of claim 1, wherein said first insulator layer is a boro-phosphosilicate glass layer, deposited via LPCVD or PECVD procedures, to a thickness between about 2000 to 20000 Angstroms.

3. The method of claim 1, wherein said lower conductive plug is formed via deposition of a polysilicon layer, obtained via LPCVD procedures, to a thickness between about 500 to 5000 Angstroms, and doped in situ, via the addition of phosphine, or arsine, to a silane ambient, and patterned via a chemical mechanical polishing procedure, or via a selective, anisotropic RIE procedure, using $Cl_2$ as an etchant.

4. The method of claim 1, wherein said second insulator layer is a boro-phosphosilicate glass layer, obtained via LPCVD or PECVD procedures, at a thickness between about 1000 to 10000 Angstroms.

5. The method of claim 1, wherein said underlying silicon nitride layer, used as a component of said composite insulator layer, is obtained via LPCVD or PECVD procedures, to a thickness between about 50 to 1000 Angstroms.

6. The method of claim 1, wherein said overlying third insulator layer, used as a component of said composite insulator layer, is a boro-phosphosilicate glass layer, obtained via LPCVD or PECVD procedures, at a thickness between about 1000 to 20000 Angstroms.

7. The method of claim 1, wherein said polysilicon layer is deposited using LPCVD procedure, to a thickness between about 200 to 2000 Angstroms, an doped in situ via the addition of arsine or phosphine, to a silane ambient.

8. The method of claim 1, wherein said crown shaped, polysilicon structure, is formed via removal of said polysilicon layer, from the top surface of said wide, composite insulator shapes, using a chemical mechanical polishing procedure.

9. The method of claim 1, wherein said third insulator layer, is removed from said wide, composite insulator shapes, via use of a buffered hydrofluoric acid solution.

10. The method of claim 1, wherein said HSG silicon layer is formed via initially forming HSG silicon seeds, on said crown shaped polysilicon structure, using LPCVD procedures, at a temperature between about 400 to 570° C., at a pressure between about 0.05 to 1.0 torr, using silane, or disilane as a source, followed by an anneal cycle, performed in a nitrogen ambient, at a temperature between about 550 to 620° C., at a pressure between about 1E-8 to 1E-9 torr.

11. The method of claim 1, wherein said capacitor dielectric layer is ONO, at an insulator thickness equivalent to the thickness of a silicon dioxide layer between about 40 to 80 Angstroms, created by an initial thermal oxidation of said HSG silicon layer, to form a silicon dioxide layer, between about 10 to 50 Angstroms, followed by a deposition of a silicon nitride layer, to a thickness between about 10 to 60 Angstroms, and thermal oxidation of said silicon nitride layer, creating a silicon oxynitride layer, on the underlying, said silicon dioxide layer.

12. A method for fabricating a crown shaped storage node structure, for a DRAM capacitor structure, featuring a capacitor surface area, with additional surface area resulting from a portion of said crown shaped storage node structure, traversing and overlying a thin, narrow insulator shape, located in the center of said crown shaped storage node structure, comprising the steps of:

providing transfer gate transistors on a semiconductor substrate, with each transfer gate transistor comprised of a polycide gate structure, on an underlying gate insulator layer, with insulator spacers on the sides of said polycide gate structure, and a source/drain region in an area of said semiconductor substrate, not covered by said polycide gate structure;

depositing a silicon oxide layer on said transfer gate transistor;

depositing a first boro-phosphosilicate glass, (BPSG), layer;

planarizing said first BPSG layer;

opening a storage node contact hole in said first BPSG layer, and in said silicon oxide layer, exposing the top surface a source region, of said source/drain region;

forming a doped polysilicon plug, in said storage node contact hole;

depositing a second BPSG layer;

creating a via hole in said second BPSG layer, exposing the top surface of said doped polysilicon plug;

forming a conductive plug, in said via hole, contacting top surface of said doped polysilicon plug;

depositing a silicon nitride layer;

depositing a third BPSG layer;

forming two, wide photoresist shapes, each with a width between about 1500 to 3000 Angstroms, on said third BPSG layer;

forming a third photoresist shape, on said third BPSG layer, directly overlying said conductive plug, with said third photoresist shape, located between the two wide photoresist shapes, and with said third photoresist shape, narrower and thinner than said two wide photoresist shapes, at a width between about 1000 to 2000 Angstroms, and at a thickness less than the thickness of said two wide photoresist shapes;

anisotropic etching of said third BPSG layer, and of said silicon nitride layer, using said two wide photoresist shapes as an etch mask, creating two wide insulator shapes, each with a width between about 1500 to 3000 Angstroms, with a thickness between about 1000 to 20000 Angstroms, and creating said thin, narrow insulator shape, with a width between about 800 to 2000 Angstroms with a thickness between about 800 to 18000 Angstroms, using said third photoresist shape as an etch mask, with said thin, narrow insulator shape, narrower in width, and thinner, than said two wide insulator shapes, and with said thin, narrow insulator shape, overlying said conductive plug, and with said thin, narrow insulator shape narrower in width than said conductive plug;

depositing a polysilicon layer;

removing said polysilicon layer from the top surface of said third BPSG layer, located on the top surface of said two wide insulator shapes, creating a crown shaped polysilicon structure, comprised of vertical polysilicon spacers, on the sides of said two wide insulator shapes, and comprised of a horizontal polysilicon shape, connecting said vertical polysilicon spacers, and traversing said thin, narrow insulator shape, with said horizontal polysilicon shape contacting a region of the top surface of said conductive plug, not covered by said thin, narrow insulator shape;

selective wet etching to remove said third BPSG layer, from said two wide insulator shapes;

selectively forming hemispherical grain, (HSG), silicon seeds on the exposed surfaces of said crown shaped polysilicon structure;

annealing to grow a HSG silicon layer, from said HSG silicon seeds, creating said crown shaped storage node structure, comprised of said HSG silicon layer, on said crown shaped polysilicon structure;

forming a capacitor dielectric layer on said crown shaped storage node electrode; and forming a polysilicon upper electrode, for said DRAM capacitor structure.

13. The method of claim 12, wherein said silicon oxide layer, is obtained via LPCVD or PECVD procedures, to a thickness between about 1000 to 10000 Angstroms, using TEOS as a source.

14. The method of claim 12, wherein said first BPSG layer is obtained using LPCVD or PECVD procedures, to a thickness between about 2000 to 20000 Angstroms.

15. The method of claim 12, wherein said doped polysilicon plug is formed from an LPCVD polysilicon layer, deposited to a thickness between about 500 to 5000 Angstroms, doped in situ, during deposition, via the addition of phosphine or arsine, to a silane ambient, and patterned using either a CMP procedure, or via a selective RIE procedure, using $Cl_2$ as an etchant.

16. The method of claim 12, wherein said second BPSG layer is obtained via LPCVD or PECVD procedures, to a thickness between about 1000 to 10000 Angstroms.

17. The method of claim 12, wherein said conductive plug, in said via hole, with a width between about 1500 to 3000 Angstroms, is comprised of doped polysilicon, or comprised of tungsten, with a titanium—titanium nitride spacer located on the sides of the via hole.

18. The method of claim 12, wherein said silicon nitride layer is obtained via LPCVD or PECVD procedures, to a thickness between about 50 to 1000 Angstroms.

19. The method of claim 12, wherein said third BPSG layer is obtained via LPCVD or PECVD procedures, to a thickness between about 1000 to 20000 Angstroms.

20. The method of claim 12, wherein said two wide insulator shapes are comprised of said third BPSG layer, and of said silicon nitride layer, obtained via an anisotropic RIE procedure, using $CHF_3$ as an etchant for said third BPSG layer, and using $CF_4$ as an etchant for said silicon nitride layer.

21. The method of claim 12, wherein said thin, narrow insulator shape is comprised of said third BPSG layer, and of said silicon nitride layer, formed via an anisotropic RIE procedure, using $CHF_3$ as an etchant for said third BPSG layer, and using $CF_4$ as an etchant for said silicon nitride layer.

22. The method of claim 12, wherein said polysilicon layer is obtained via LPCVD procedures, to a thickness between about 200 to 2000 Angstroms, and doped in situ during deposition, via the addition of phosphine or arsine, to a silane ambient.

23. The method of claim 12, wherein said polysilicon layer is removed from the top surface of said third BPSG layer, residing on said two wide insulator shapes, via a CMP procedure.

24. The method of claim 12, wherein said third BPSG layer, of said two wide insulator shapes, is selectively removed from underlying said silicon nitride layer, using a buffered hydrofluoric acid solution.

25. The method of claim 12, wherein said HSG silicon seeds are formed using LPCVD procedures, at a temperature between about 400 to 570° C., at a pressure between about 0.05 to 1.0 torr, using silane, or disilane, as a source.

26. The method of claim 12, wherein said HSG silicon layer is formed from said HSG silicon seeds, during an anneal cycle, performed at a temperature between about 550 to 620° C., at a pressure between about 1E-8 to 1E-9 torr, in a nitrogen ambient.

* * * * *